United States Patent
Miyajima et al.

(10) Patent No.: US 6,804,275 B2
(45) Date of Patent: Oct. 12, 2004

(54) HEAT SINK AND SEMICONDUCTOR LASER APPARATUS AND SEMICONDUCTOR LASER STACK APPARATUS USING THE SAME

(75) Inventors: Hirofumi Miyajima, Hamamatsu (JP); Hirofumi Kan, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 0 days.

(21) Appl. No.: 09/773,510

(22) Filed: Feb. 2, 2001

(65) Prior Publication Data

US 2001/0004312 A1 Jun. 21, 2001

Related U.S. Application Data

(63) Continuation-in-part of application No. PCT/JP99/01603, filed on Mar. 29, 1999.

(30) Foreign Application Priority Data

Aug. 18, 1998 (JP) .......................................... P10-231576

(51) Int. Cl.[7] .......................... H01L 23/36; H01S 3/04; H05K 7/20
(52) U.S. Cl. ...................... 372/36; 257/712; 257/714; 361/689; 361/702; 372/34; 372/35
(58) Field of Search ................................ 257/678, 701, 257/706, 707, 714, 712–5, 625, 675, 717, 720; 361/689, 702; 372/34–36, 43–50

(56) References Cited

U.S. PATENT DOCUMENTS 4,791,634 A * 12/1988 Miyake ........................ 372/34
5,079,619 A    1/1992 Davidson ...................... 357/81
5,105,429 A    4/1992 Mundinger et al. ........... 372/34
5,105,430 A    4/1992 Mundinger et al. ........... 372/35
5,785,754 A    7/1998 Yamamoto et al. ........... 117/89
5,903,583 A    5/1999 Ullman et al. ................. 372/35
6,144,683 A * 11/2000 Floyd .......................... 372/50

FOREIGN PATENT DOCUMENTS

| DE | 3436545 A1 | * 10/1986 | .......... H01L/23/46 |
| DE | 43 15 580 A1 | 11/1994 | |
| DE | 195 06 093 A1 | 8/1996 | |
| GB | 1597829 A | * 9/1981 | ............ H05K/7/20 |
| JP | 8-139479 | 5/1996 | |
| JP | 408181392 A | * 7/1996 | ............. H01S/3/18 |
| JP | 8-227953 | 9/1996 | |
| JP | 08-227953 | 9/1996 | |
| JP | 09-102568 | 4/1997 | |
| JP | 9-102568 | 4/1997 | |
| JP | 409102568 A | * 4/1997 | ......... H01L/23/473 |

* cited by examiner

Primary Examiner—Nathan J. Flynn
Assistant Examiner—Johannes Mondt
(74) Attorney, Agent, or Firm—Morgan, Lewis & Bockius LLP (57) ABSTRACT

A semiconductor laser stack apparatus 1 comprises three semiconductor lasers 2a to 2c, two copper plates 3a and 3b, two lead plates 4a and 4b, a supply tube 5, a discharge tube 6, four insulating members 7a to 7d, and three heat sinks 10a to 10c. Here, the heat sink 10a to 10c is formed by a lower planar member 12 having an upper face formed with a supply water path groove portion 22, an intermediate planar member 14 formed with a plurality of water guiding holes 38, and an upper planar member 16 having a lower face formed with a discharge water path groove portion 30 which are successively stacked one upon another, whereas their contact surfaces are joined together.

9 Claims, 9 Drawing Sheets

HEAT SINK AND SEMICONDUCTOR LASER APPARATUS AND SEMICONDUCTOR LASER STACK APPARATUS USING THE SAME

RELATED APPLICATION

The present application is a continuation-in-part application of PCT application No. PCT/JP99/01603 filed on Mar. 29, 1999, designating U.S.A. and now pending.

BACKGROUND OF THE INVENTION

1. Field of the Invention

The present invention relates to a heat sink employed for dissipating heat from a heating element such as semiconductor device, and a semiconductor laser apparatus and semiconductor laser stack apparatus using the same.

2. Related Background Art

Known as a heat sink for dissipating heat from a heating element such as semiconductor device is one having a structure for circulating cooling water therein, such as the one disclosed in Japanese Patent Application Laid-Open No. HEI 8-139479, for example. This heat sink comprises a pipe-like supply water path for supplying pressurized cooling water, a discharge water path for discharging the cooling water, and a nozzle for injecting into the discharge water path the cooling water supplied to the supply water path. The cooling water injected from the nozzle under a high pressure efficiently dissipates heat from the heating element mounted at a part directly above the nozzle.

SUMMARY OF THE INVENTION

However, the heat sink in accordance with the above-mentioned prior art has a problem as follows. Namely, since the heat sink in accordance with the above-mentioned prior art has a pipe-like supply water path, the heat sink enhances its thickness, thereby becoming larger. Though the heat sink may be made thinner by reducing the diameter of pipe, the making thereof becomes quite difficult. Therefore, it is an object of the present invention to provide a heat sink which is relatively easy to make and can be made thinner, and a semiconductor laser apparatus and semiconductor laser stack apparatus using the same.

For overcoming the above-mentioned problem, the present invention provides a heat sink comprising a first planar member having an upper face formed with a first groove portion, a second planar member having a lower face formed with a second groove portion, and a partition disposed between the upper face of the first planar member and the lower face of the second planar member; the partition being formed with a hole for communicating a first space and a second space to each other, the first space being formed by the first groove portion and a lower face of the partition, the second space being formed by the second groove portion and an upper face of the partition; the heat sink further comprising a supply port for supplying a fluid into the first space and a discharge port for discharging the fluid from the second space.

The heat sink can be made thinner since it is constituted by first and second planar members provided with groove portions, and a partition provided with a hole. Also, it can be made by relatively simple steps such as those of forming groove portions and forming a hole, namely, its making becomes relatively easy.

The present invention provides a semiconductor laser apparatus comprising the above-mentioned heat sink and a semiconductor laser mounted on an upper face of the second planar member of the heat sink.

Since the above-mentioned heat sink is used, the heat sink can be made thinner, and its making becomes easier, whereby it becomes possible for the semiconductor laser apparatus to be made smaller and easier.

The present invention provides a semiconductor laser stack apparatus comprising first and second heat sinks and first and second semiconductor lasers, the first and second heat sinks being the above-mentioned heat sink, the first semiconductor laser being held between an upper face of the second planar member of the first heat sink and a lower face of the first planar member of the second heat sink, the second semiconductor laser being mounted on an upper face of the second planar member of the second heat sink.

Since the above-mentioned heat sink is used, the heat sink can be made thinner, and its making becomes easier, whereby it becomes possible for the semiconductor laser stack apparatus to be made smaller and easier.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

The semiconductor laser stack apparatus in accordance with an embodiment of the present invention will be explained with reference to drawings. The semiconductor laser apparatus and heat sink of the present invention are included in the semiconductor laser stack apparatus in accordance with this embodiment.

Figure 1:
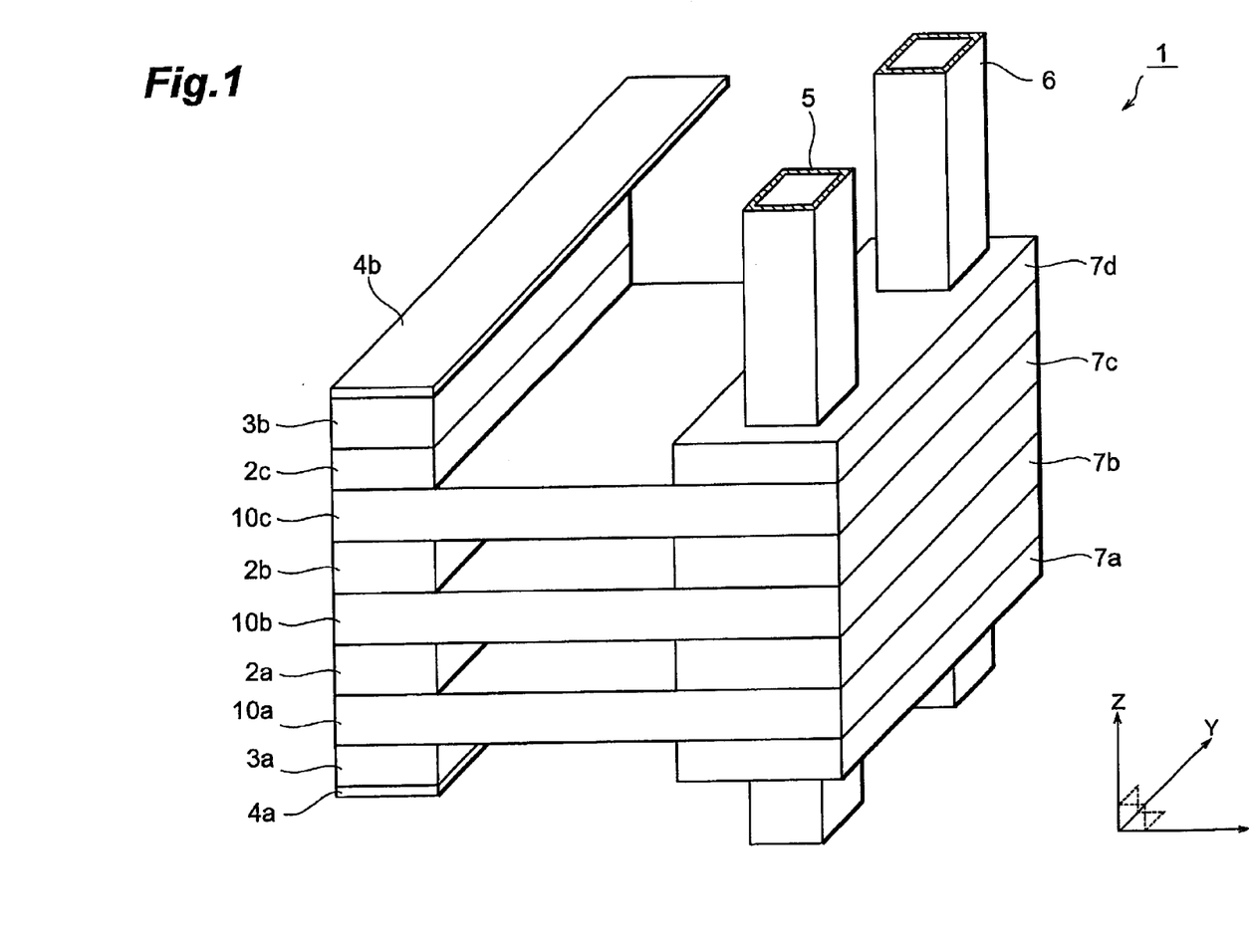
FIG. 1 is a perspective view of a semiconductor laser stack apparatus.

First, the configuration of the semiconductor laser stack apparatus in accordance with this embodiment will be explained. FIG. 1 is a perspective view of the semiconductor laser stack apparatus in accordance with this embodiment. As shown in FIG. 1, the semiconductor laser stack apparatus 1 in accordance with this embodiment comprises three semiconductor lasers 2a to 2c, two copper plates 3a and 3b, two lead plates 4a and 4b, a supply tube 5, a discharge tube 6, four insulating members 7a to 7d, and three heat sinks 10a to 10c. In the following, each constituent will be explained. For convenience of explanation, the positive z-axis direction and negative z-axis direction in FIG. 1 will be referred to as the upper and lower sides, respectively, in the following.

The semiconductor lasers 2a to 2c are semiconductor lasers each having a plurality of laser emission points arranged in a predetermined direction (y-axis direction). The semiconductor laser 2a is held between the upper face of heat sink 10a (the upper face of an upper planar member 16 which will be mentioned later, ditto in the following) and the lower face of heat sink 10b (the lower face of a lower planar member 12 which will be mentioned later, ditto in the following); the semiconductor laser 2b is held between the upper face of heat sink 10b and the lower face of heat sink 10c; and the semiconductor laser 2c is mounted on the upper face of heat sink 10c. Here, each of the semiconductor lasers 2a to 2c is disposed such that the direction in which its laser emission points are arranged and the upper faces of heat sinks 10a to 10c are parallel to each other, whereas the emission surface of each of the semiconductor lasers 2a to 2c is substantially flush with respective one side face of the heat sinks 10a to 10c.

The lower face of semiconductor laser 2a is electrically connected to the lead plate 4a by way of the copper plate 3a, whereas the upper face of semiconductor laser 2c is electrically connected to the lead plate 4b by way of the copper plate 3b. Here, if voltage is applied between the lead plates 4a and 4b, then laser light can be outputted from the semiconductor lasers 2a to 2c.

Each of the supply tube 5 and discharge tube 6 is disposed so as to penetrate through the heat sinks 10a to 10c. In further detail, the supply tube 5 is connected to a supply port 44 (which will be explained later in detail) formed in each of the heat sinks 10a to 10c, whereas the discharge tube 6 is connected to a discharge port 46 (which will be explained later in detail) formed in each of the heat sinks 10a to 10c. Therefore, a fluid such as cooling water can be supplied from the supply tube 5 to the heat sinks 10a to 10c, and the cooling water can be discharged from the heat sinks 10a to 10c to the discharge tube 6.

The insulating members 7a, 7b, 7c, 7d made of rubber are disposed, respectively, on the lower side of heat sink 10a, in the gap between the upper face of heat sink 10a and the lower face of heat sink 10b, in the gap between the upper face of heat sink 10b and the lower face of heat sink 10c, and on the upper side of heat sink 10c so as to surround the supply tube 5 and discharge tube 6. The insulating members 7a to 7d function to secure insulation between the individual heat sinks and prevent the cooling water from leaking.

Figure 2A:
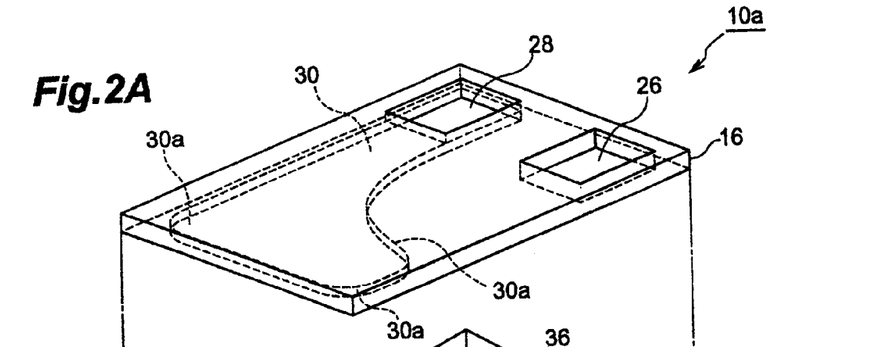
FIGS. 2A to 2C are exploded perspective views of a heat sink.
Figure 2B:
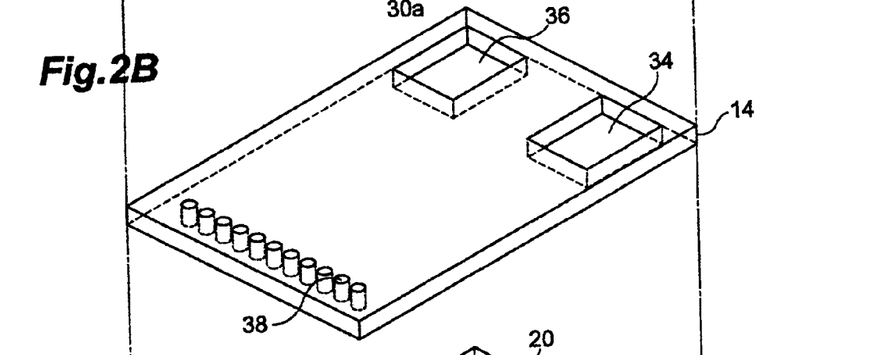
Figure 2C:
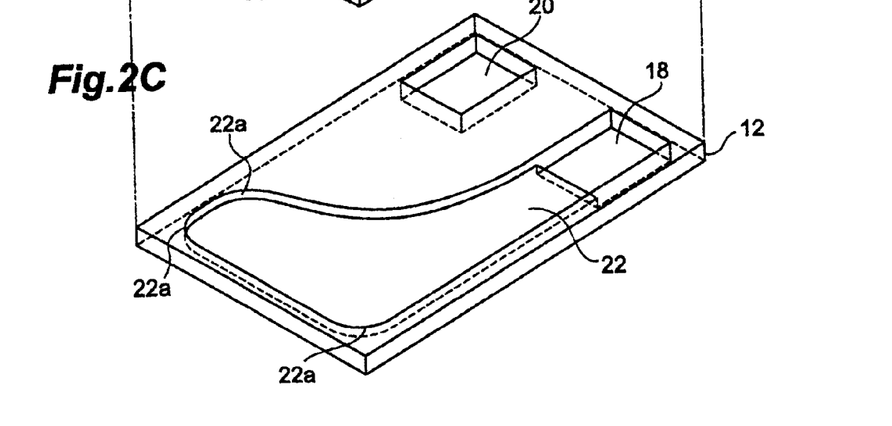
Figure 3:
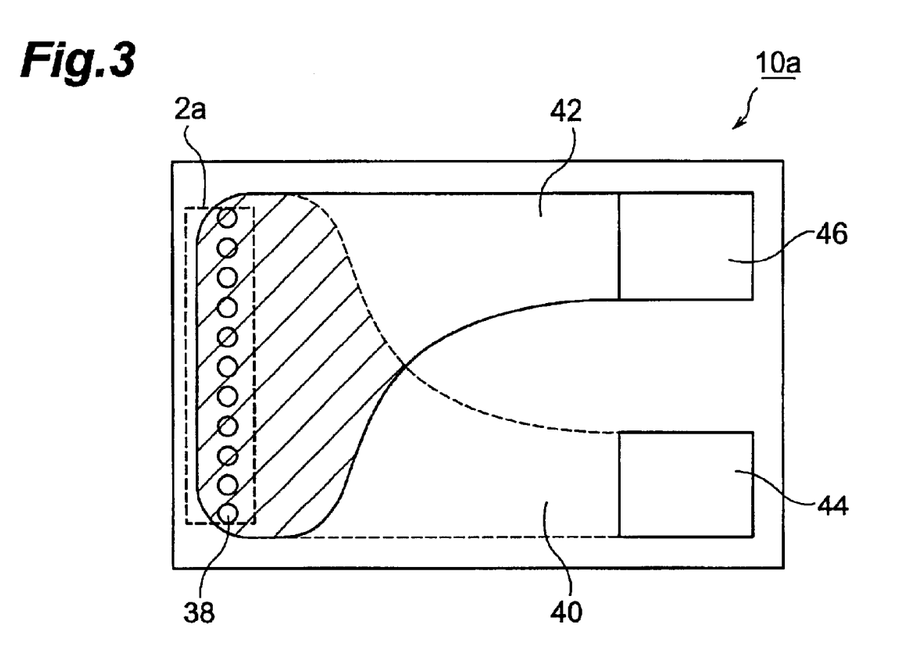
FIG. 3 is an explanatory view of the heat sink as seen from thereabove.
Figure 4:
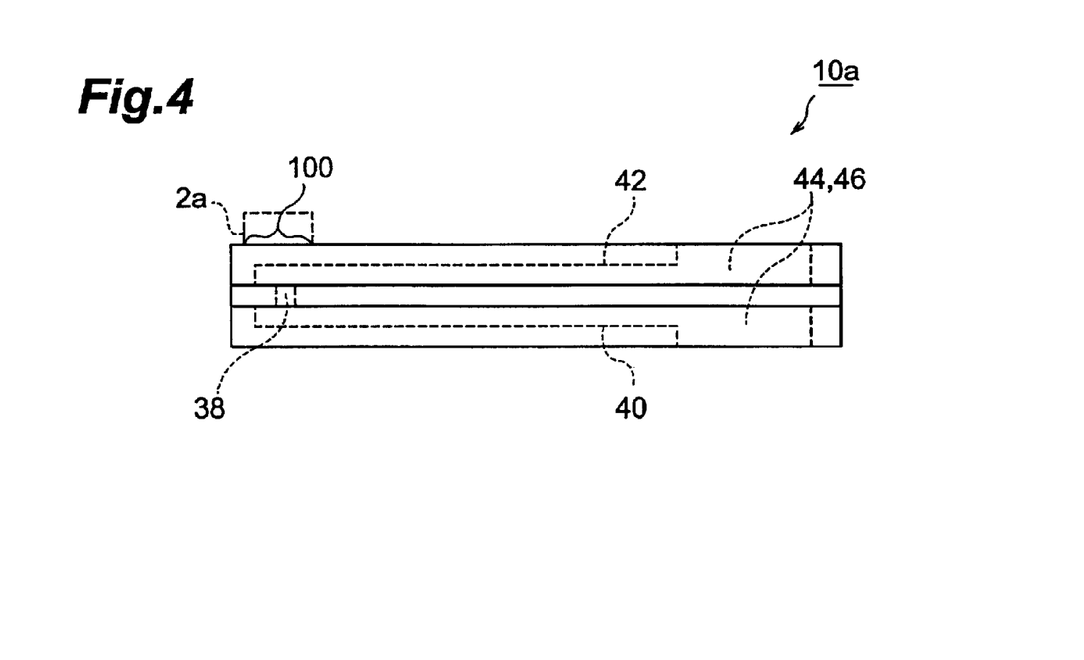
FIG. 4 is an explanatory view of the heat sink as seen from a side thereof.

The heat sinks 10a to 10c are configured as follows. Here, since the heat sinks 10a to 10c have the same configuration, only the heat sink 10a will be explained in the following. FIGS. 2A to 2C are exploded perspective views of the heat sink 10a, FIG. 3 is an explanatory view of the heat sink 10a as seen from thereabove, and FIG. 4 is an explanatory view of the heat sink 10a as seen from a side thereof.

As shown in FIGS. 2A to 2C, the heat sink 10 is formed by a lower planar member 12 (first planar member), an intermediate planar member 14 (partition), and an upper planar member 16 (second planar member) which are successively stacked one upon another, whereas their contact surfaces are joined together by the diffusion bonding method, by brazing, or by use of an adhesive.

The lower planar member 12 is a plate made of copper having a thickness of about 400 μm with two through holes 18, 20. A supply water path groove portion 22 (first groove portion) having a depth of about 200 μm is formed on the upper face (the surface in contact with the intermediate planar member 14) side of the lower planar member 12. One end side of the supply water path groove portion 22 is connected to the through hole 18, whereas the other end side spreads in the widthwise direction of lower planar member 12 (y-axis direction of FIG. 1). Also, in the supply water path groove portion 22, corner portions 22a are rounded in order to lower the flow resistance of the cooling water flowing through the heat sink 10a and reduce its stagnation. Here, the supply water path groove portion 22 is formed by etching the upper face of lower planar member 12.

The upper planar member 16 is also a plate made of copper having a thickness of about 400 μm with two through holes 26, 28 located at respective positions corresponding to the through holes 18, 20 of the lower planar member 12. A discharge water path groove portion 30 (second groove portion) having a depth of about 200 μm is formed on the lower face (the surface in contact with the intermediate planar member 14) side of the upper planar member 16. One end side of the discharge water path groove portion 30 is connected to the through hole 28, whereas the other end side spreads in the widthwise direction of upper planar member 16. Here, at least a part of the discharge water path groove portion 30 is formed at a part (the hatched part of FIG. 3) overlapping the supply water path groove portion 22 formed in the lower planar member 12. Also, in the discharge water path groove portion 30, corner portions 30a are rounded in order to lower the flow resistance of the cooling water flowing through the heat sink 10a and reduce its stagnation. Here, the discharge water path groove portion 30 is formed by etching the lower face of upper planar member 16.

The intermediate planar member 14 is a plate made of copper having a thickness of about 100 μm having two through holes 34, 36 at respective positions corresponding to the through holes 18, 20 of the lower planar member 12. The part where the supply water path groove portion 22 formed in the lower planar member 12 and the discharge water path groove portion 30 formed in the upper planar member 16 overlap each other is formed with a plurality of water guiding holes 38. Here, the water-guiding holes 38 are formed by etching the intermediate planar member 14 from both sides.

In particular, the upper face of upper planar member 16 has a semiconductor laser mounting area 100 for mounting the semiconductor laser 2a, which is a heating element to be cooled, whereas a plurality of water guiding holes 38 are disposed at positions opposing the semiconductor laser mounting area 100. Namely, since the semiconductor laser 2a has a substantially rectangular parallelepiped form, the semiconductor laser mounting area 100 has a rectangular form, and a plurality of water guiding holes 38 are formed so as to be arranged in a row in the longitudinal direction of this rectangular form (y-axis direction of FIG. 1).

When the upper face of lower planar member 12 and the lower face of intermediate planar member 14 are joined together, and the upper face of intermediate planar member 14 and the lower face of upper planar member 16 are joined together, as shown in FIG. 3 or 4, a supply water path 40 (first space) for supplying cooling water is formed by the supply water path groove portion 22 formed in the lower planar member 12 and the lower face of intermediate planar member 14 and, similarly, a discharge water path 42 (second space) for discharging the cooling water is formed by the discharge water path groove portion 30 formed in the upper planar member 16 and the upper face of intermediate planar member 14. Here, the water guiding hole 38 has a sufficiently small cross-sectional area for injecting into the discharge water path 42 the cooling water supplied to the supply water path 40.

The through hole 18 formed in the lower planar member 12, the through hole 34 formed in the intermediate planar member 14, and the through hole 26 formed in the upper planar member 16 are connected together, so as to form the supply port 44 for supplying cooling water to the supply water path 40; whereas the through hole 20 formed in the lower planar member 12, the through hole 36 formed in the intermediate planar member 14, and the through hole 28 formed in the upper planar member 16 are connected together, so as to form a discharge port 46 for discharging the cooling water from the discharge water path 42.

Operations and effects of the semiconductor laser stack apparatus in accordance with this embodiment will now be explained. In the semiconductor laser stack apparatus 1, three planar members, i.e., lower planar member 12, intermediate planar member 14, and upper planar member 16, constitute the heat sink 10a to 10c. As a consequence, the heat sinks 10a to 10c can be constructed very thin, whereby the semiconductor laser stack apparatus 1 can attain a very small configuration.

The heat sink 10a to 10c can be made by relatively simple steps such as those of forming groove portions like the supply water path groove portion 22 and discharge water path groove portion 30, and those of forming holes like the water guiding holes 38, whereby the making thereof is relatively easy. As a result, it becomes relatively easy to make the semiconductor laser stack apparatus 1.

Since the water guiding holes 38 are disposed at positions opposing the semiconductor laser mounting area 100 in the heat sinks 10a to 10c, the semiconductor laser stack apparatus 1 in accordance with this embodiment can effectively cool the semiconductor lasers 2a to 2c to be cooled. As a result, it becomes possible for the semiconductor lasers 2a to 2c to output stable laser light.

The semiconductor laser stack apparatus 1 in accordance with this embodiment has a plurality of water guiding holes 38 in the heat sink 10a to 10c. Consequently, it can cool the semiconductor lasers 2a to 2c uniformly over a wide range. As a result, spatially uniform laser light can be outputted.

In the semiconductor laser stack apparatus 1 in accordance with this embodiment, the water guiding holes 38 of heat sinks 10a to 10c have a sufficiently small cross-sectional area in order to inject into the discharge water path 42 the cooling water supplied to the supply water path 40. Therefore, the boundary layer in the inner wall of discharge water path 42 can be broken, whereby the cooling efficiency of semiconductor lasers 2a to 2c increases. As a result, it becomes possible for each of the semiconductor lasers 2a to 2c to output more stable laser light.

Since the semiconductor laser stack apparatus 1 in accordance with this embodiment comprises one supply tube 5 connected to the supply port 44 of each of the heat sinks 10a to 10c and one discharge tube 6 connected to the discharge port 46 of each of the heat sinks 10a to 10c, other connection tubes connecting the supply tube 5 and the supply port 44 to each other, other connection tubes connecting the discharge tube 6 and the discharge port 46 to each other, and the like become unnecessary, whereby a further smaller size is achieved.

Figure 5:
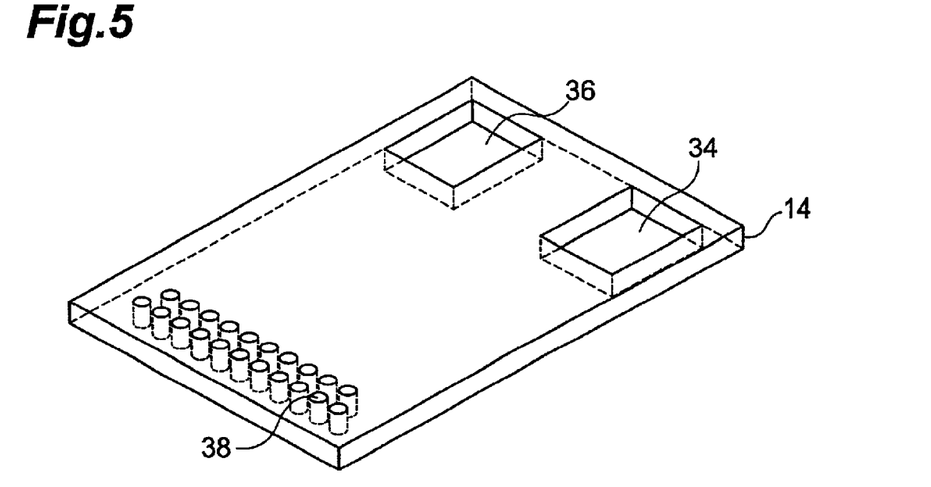
FIG. 5 is a perspective view of an intermediate planar member.
Figure 6:
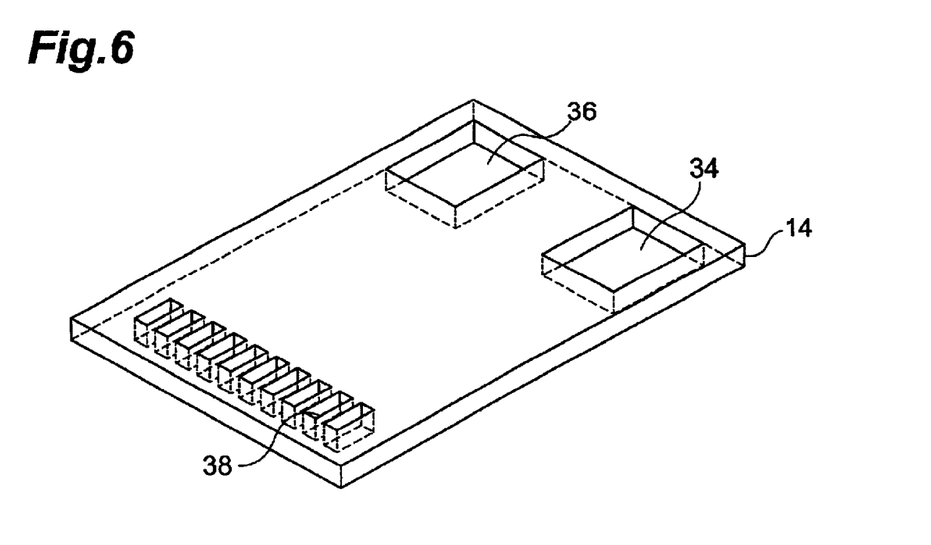
FIG. 6 is a perspective view of an intermediate planar member.
Figure 7:
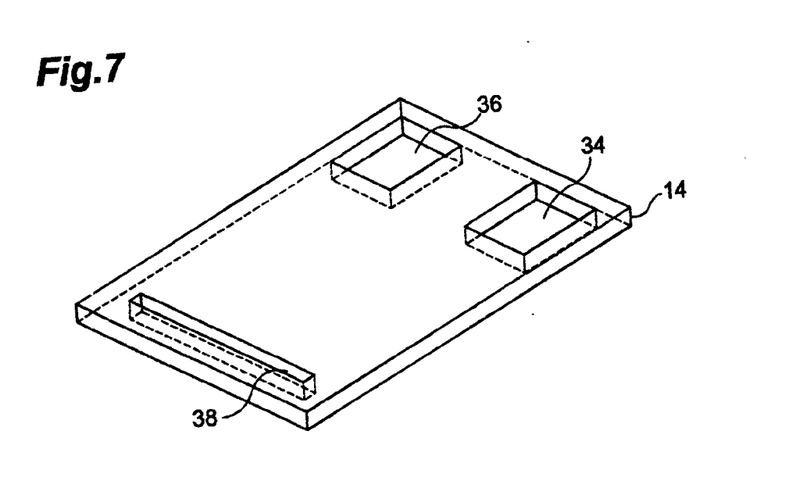
FIG. 7 is a perspective view of an intermediate planar member.
Figure 8:
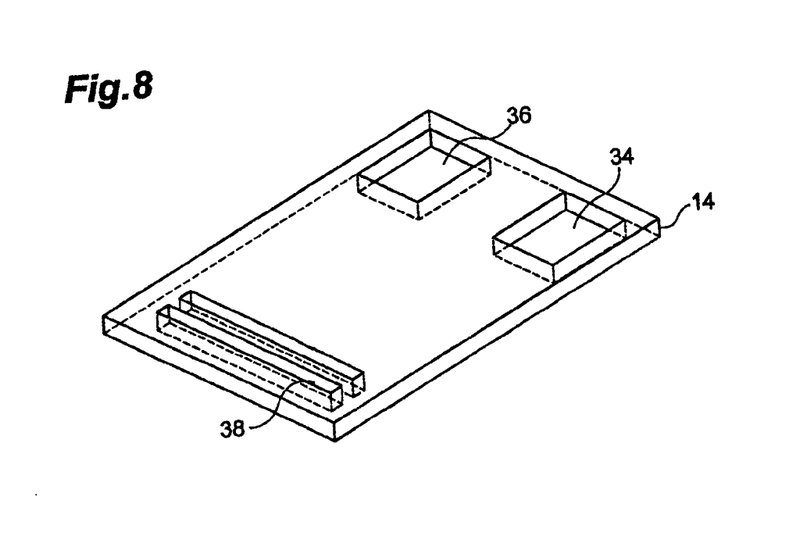
FIG. 8 is a perspective view of an intermediate planar member.

Though the plurality of water guiding holes 38 are formed so as to be arranged in a row in the longitudinal direction of semiconductor laser mounting area 100 in the heat sinks 10a to 10c in the semiconductor laser stack apparatus 1 in accordance with the above-mentioned embodiment, they may be formed so as to be arranged in two rows in the longitudinal direction of laser mounting area 100 as shown in FIG. 5. As shown in FIG. 6, slit-like water guiding holes 38 each extending in the transverse direction of the semiconductor laser mounting area 100 may be formed so as to be arranged in a row in the longitudinal direction of semiconductor laser mounting area 100. Also, one slit-like water guiding hole 38 extending in the longitudinal direction of semiconductor laser mounting area 100 may be formed as shown in FIG. 7, or two such guide holes may be arranged as shown in FIG. 8.

Figures 9A, 9B:
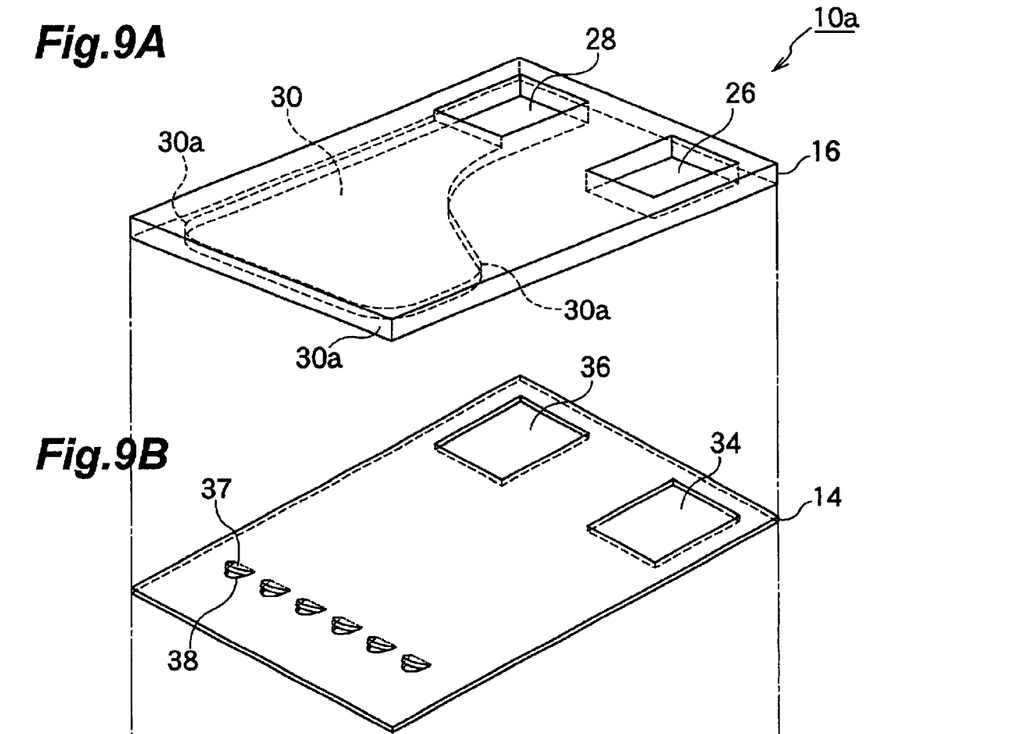
FIGS. 9A to 9C are exploded perspective views of a heat sink.
Figure 9C:
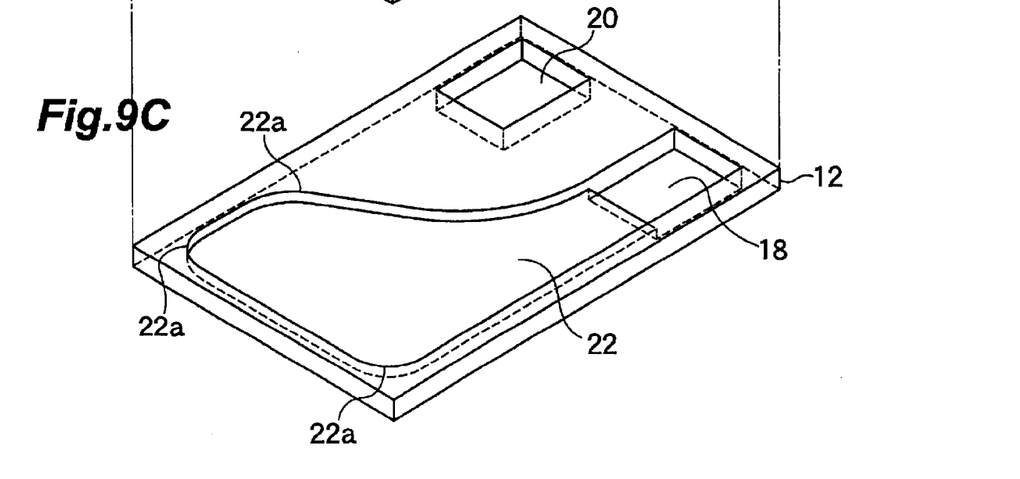
Figure 10:
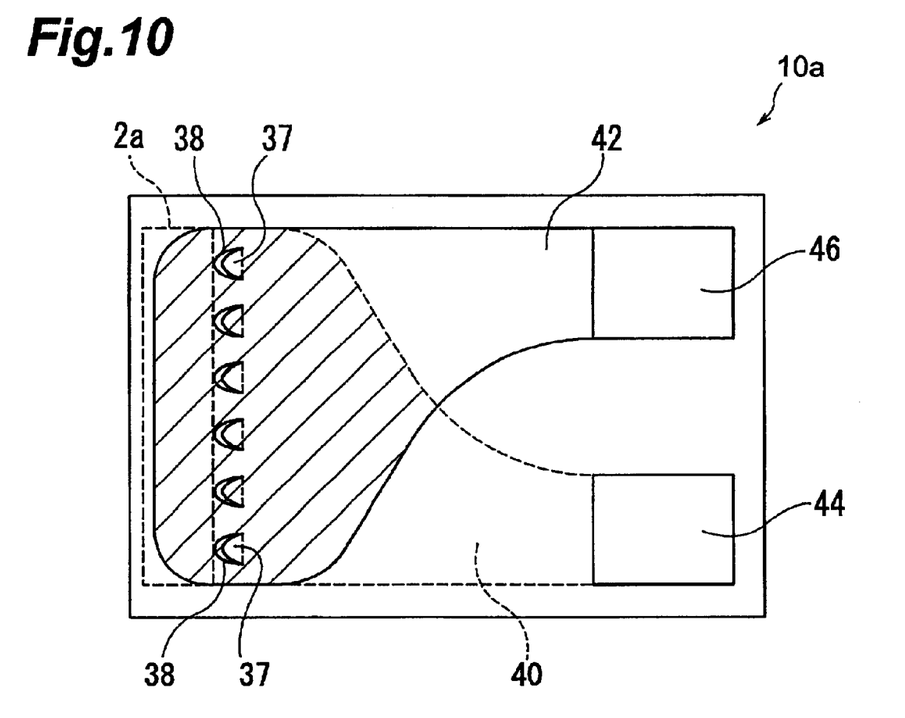
FIG. 10 is an explanatory view of the heat sink as seen from thereabove.
Figure 11:
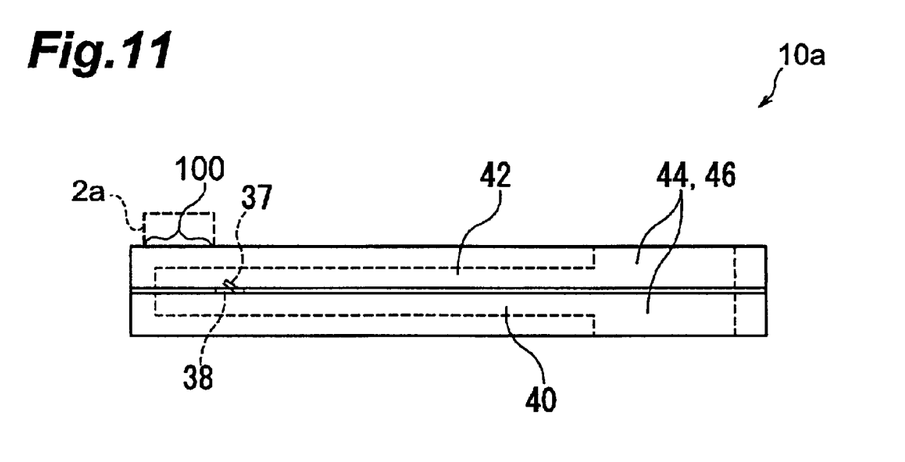
FIG. 11 is an explanatory view of the heat sink as seen from a side thereof.

The heat sink 10a may be the one shown in exploded perspective views of FIGS. 9A and 9B. Namely, while its lower planar member 12 and upper planar member 16 are similar to those explained with reference to FIGS. 2A and 2B, the intermediate planar member 14 is formed with a plurality of risers 37 raised toward the upper planar member 16 from their respective U-shaped incisions formed in a part of the intermediate planar member 14 and their corresponding water guiding holes 38 formed by raising the risers 37. That is, the water guiding holes 38 become holes for injecting into the discharge water path 42 the cooling water supplied to the supply water path 40, whereas the risers 37 are disposed at the edge portions of respective water guiding holes 38 on the discharge water path 42 side and become guide pieces for restricting the direction in which the cooling water is outputted from the water guiding holes 38 to the discharge water path 42. In this heat sink 10a, if cooling water pressurized to a hydraulic pressure of about 2 to 4 kgf/cm² is supplied from the supply port 44 to the supply water path 40, then the cooling water flows through the supply water path 40 toward the water guiding holes 38, and are injected into the discharge water path 42 by way of the water guiding holes 38. The cooling water injected from the water guiding holes 38 dissipates heat from the semiconductor laser 2a mounted at the semiconductor laser mounting area 100. Here, if the semiconductor laser 2a is not disposed directly above the water guiding holes 38, then the cooling water injected from the water guiding holes 38 under a high pressure cannot hit the part directly under the semiconductor laser mounting area 100, whereby the heat-dissipating efficiency will decrease. In the configuration mentioned above, by contrast, even though the semiconductor laser 2a is mounted at a position not directly above the water guiding holes 38 as shown in FIGS. 10 and 11, the direction of the cooling water injected from the water guiding holes 38 can be restricted by the risers 37 toward the semiconductor laser mounting area 100, so that the cooling water injected under a high pressure can hit the part directly under the semiconductor laser mounting area 100. As a result, the heat-dissipating efficiency improves.

Since the risers 37, which are guide pieces, are formed by cutting and raising a part of a sheet-like intermediate planar member 14, the guide pieces can easily be formed without separately making members or the like for guide pieces.

Since the risers 37, which are guide pieces, are formed like a sheet, the flow of cooling water directed from the upper part of discharge water path 42 toward the discharge port 46 after dissipating heat from the semiconductor laser 2a is prevented from being blocked by the risers 37, whereby the flow resistance of discharge water path 42 resulting from the risers 37 can be kept low. As a result, the heat-dissipating efficiency can further be improved.

Since the risers 37 are formed thin with a thickness of about 100 μm while the pressure of the cooling water supplied to the supply water path 40 is high, i.e., about 2 to 4 kgf/cm², the degree of opening of risers 37 changes depending on the hydraulic pressure of the cooling water supplied to the supply water path 40, whereby the substantial area of water guiding holes 38 is altered. More specifically, the risers 37 rise as the hydraulic pressure of cooling water increases, whereby the substantial area of water guiding holes 38 becomes greater; whereas the risers 37 fall as the hydraulic pressure of cooling water decreases, whereby the substantial area of water guiding holes 38 becomes smaller. Therefore, notwithstanding the change in hydraulic pressure, the injecting rate of cooling water is kept substantially constant. As a result, regardless of the change in hydraulic pressure, the injecting rate of cooling water can be maintained substantially constant, whereby heat can uniformly be dissipated from the semiconductor laser 2*a*.

Figures 12A, 12C:
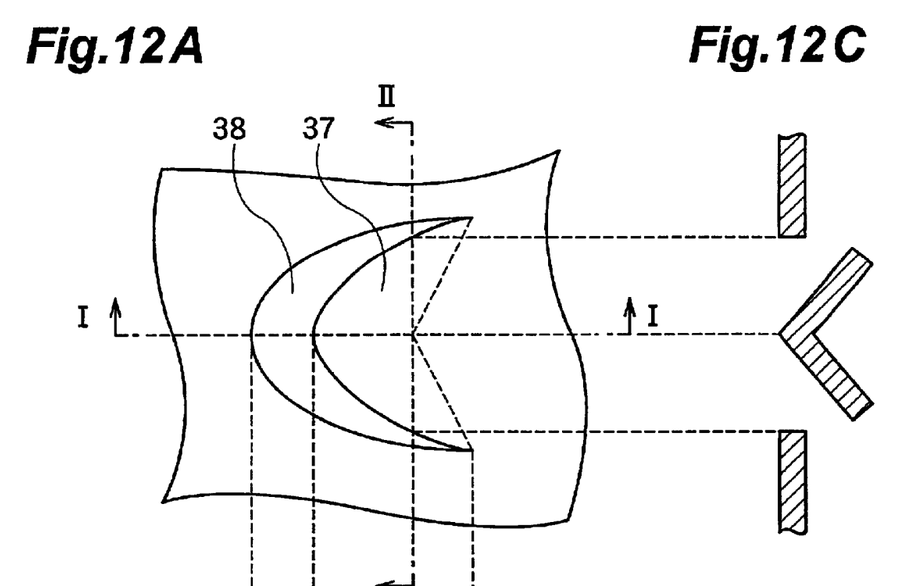
FIG. 12A is a plan view of a riser.
FIG. 12C is a sectional view taken along the line II—II of FIG. 12A.
Figure 12B:
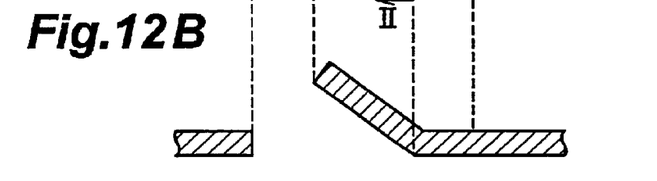
FIG. 12B is a sectional view taken along the line I—I of FIG. 12A.

Though the riser 37 is formed like a flat sheet in the heat sink 10 in accordance with the above-mentioned embodiment, it may be a riser 37 having a V-shaped cross section as shown in FIGS. 12A to 12C. Here, FIG. 12A is a plan view of the riser 37, FIG. 12B is a sectional view taken along the line I—I of FIG. 12A, and FIG. 12C is a sectional view taken along the line II—II of FIG. 12A.

If the riser 37 has a V-shaped cross section, then cooling water is injected from both side portions of the riser 37 as well, so that the cooling water can be injected over a wider area, while the flow resistance of the cooling water can be lowered at the time when it flows toward the discharge port 46 after cooling the semiconductor laser 2*a*.

Figure 13A:
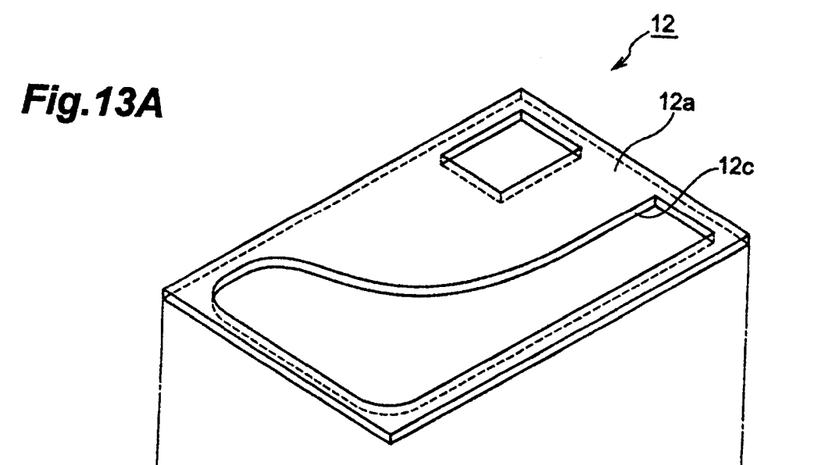
FIGS. 13A and 13B are exploded perspective views of a lower planar member.
Figure 13B:
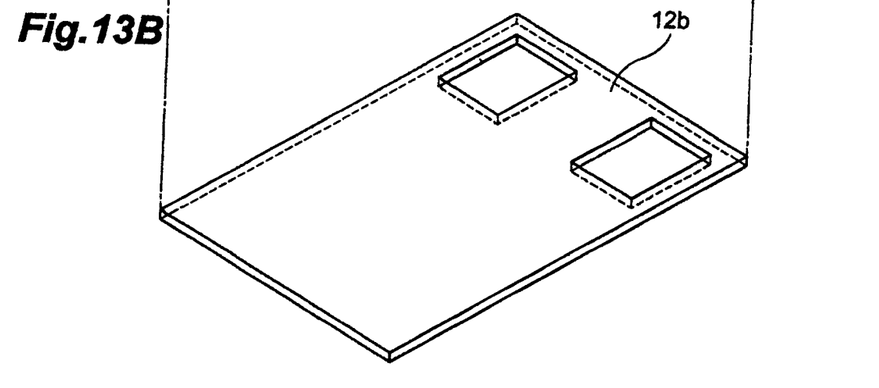

Though the supply water path groove portion 22 of lower planar member 12 in the heat sink 10*a* in the semiconductor laser stack apparatus 1 in accordance with the above-mentioned embodiment is formed by etching the upper face of the lower planar member 12, it may be formed as shown in FIGS. 13A and 13B by stacking and bonding a first plate 12*a* having a hole 12*c* for forming side faces of the supply water path groove portion 22 and a second plate 12*b* for forming the bottom face of supply water path groove portion 22 onto each other. Here, the upper planar member 16 can also be formed by stacking and bonding two plates as mentioned above.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor laser apparatus comprising;
    a heat sink made of copper and comprising;
        a first planar member having first and second faces opposite to each other and having a first groove portion in the first face thereof;
        a second planar member having first and second faces opposite to each other and having a second groove portion in the second face thereof;
        a partition having a first surface and a second surface and disposed between the first surface of the first planar member and the second surface of the second planar member, wherein the first groove portion and the second face of the partition define a first space, the second groove portion and the first surface of the partition define a second space, and the partition has a hole for communicating between the first space and the second space;
        a supply port communicating to the first space for supplying a fluid into the first space; and
        a discharge port communicating to the second space for discharging a fluid from the second space;
    a semiconductor laser device having first and second surfaces opposite to each other and mounted on the first face of the second planar member;
    a first copper plate electrically contacting the first surface of the semiconductor laser device;
    a second copper plate electrically contacting the second surface of the first planar member such that the semiconductor laser device performs emission by application of a predetermined voltage between the first and second copper plates;
    a rubber insulating member arranged in a peripheral region of the supply port in the first face of the second planar member and in a peripheral region of the discharge port in the second face of the first planar member,
    wherein the hole in the partition has a sufficiently small cross-sectional area for injecting fluid into the second space such that when pressurized fluid is supplied from the supply port to the first space, the fluid is injected toward the predetermined area on which the semiconductor laser device is mounted.

2. The semiconductor laser apparatus according to claim 1, wherein the partition comprises a plurality of holes arranged at a position opposing a predetermined area in which the semiconductor laser apparatus is mounted on the first face of the second planar member and arranged along a longitudinal direction of the area and in a row.

3. The semiconductor laser apparatus according to claim 1, further comprising a guide piece for restricting a direction in which the fluid is outputted from the second space at an edge portion of the hole in the partition.

4. The semiconductor laser apparatus according to claim 1, wherein the semiconductor laser device comprises a plurality of laser emission points arranged in a predetermined direction oriented so as to be substantially parallel with the first face of the second planar member.

5. A semiconductor laser stack apparatus comprising:
    first and second heat sinks made of copper and comprising:
        a first planar member having first and second faces opposite to each other and having a first groove portion in the first face thereof;
        a second planar member having first and second faces opposite to each other and having a second groove portion in the second face thereof;
        a partition having a first surface and a second surface and disposed between the first surface of the first planar member and the second surface of the second planar member, wherein the first groove portion and the second face of the partition define a first space, the second groove portion and the first surface of the partition define a second space, and the partition has a hole for communicating between the first space and the second space;
        a supply port communicating to the first space for supplying a fluid into the first space; and
        a discharge port communicating to the second space for discharging a fluid from the second space;
    a first semiconductor laser device having first and second surfaces opposite to each other and mounted on the first face of the second planar member of the first heat sink;
    a first copper plate electrically contacting the first surface of the first semiconductor laser device;
    a second copper plate electrically contacting the second face of the first planar member of the second heat sink;
    a second semiconductor laser device positioned between the second face of the first heat sink and the first face of the second heat sink, such that the first and second semiconductor laser devices perform emission by application of a predetermined voltage between the first and second copper plates; and rubber insulating members arranged in a peripheral region of the supply port in each of the first and second heat sinks in the first face of the second planar member in each of the first and second heat sinks and in a peripheral region of the discharge port in each of the first and second heat sinks in the second face of the first planar member in each of the first and second heat sinks, wherein each hole in each of the first and second heat sinks has a sufficiently small cross-sectional area for injecting fluid into the second space in each of the first and second heat sinks such that when a pressurized fluid is supplied from the supply ports of the first and second heat sinks to the first space in each the first and second heat sinks, the fluid is injected toward the predetermined area on which each semiconductor laser device is mounted.

6. A semiconductor laser stack apparatus according to claim 5, wherein each of the partitions in the first and second heat sink comprises a plurality of holes arranged at a position opposing a predetermined area in which the semiconductor laser apparatus is mounted on the first face of the second planar member and arranged along a longitudinal direction of the area and in a row.

7. The semiconductor laser stack apparatus according to claim 5, wherein each of the first and second heat sinks comprises a guide piece for restricting a direction in which the fluid is outputted to the second space in each of the first and second heat sinks at an edge portion of the hole of each of the first and second heat sinks.

8. The semiconductor laser stack apparatus according to claim 5, wherein each of the first and second semiconductor laser devices comprises a plurality of laser emission points arranged in a predetermined direction oriented so as to be substantially parallel with the first face of the second planar member in each of the first and second heat sinks.

9. The semiconductor laser stack apparatus according to claim 5, further comprising a supply tube connected to both of the supply ports of the first and second heat sinks; and a discharge tube connected to both of the discharge ports of the first and second heat sinks.

* * * * *